(12) United States Patent
Hopkins et al.

(10) Patent No.: US 9,478,643 B2
(45) Date of Patent: Oct. 25, 2016

(54) MEMORY STRUCTURE WITH SELF-ALIGNED FLOATING AND CONTROL GATES AND ASSOCIATED METHODS

(71) Applicant: Intel Corporation, Santa Clara, CA (US)

(72) Inventors: John Hopkins, Boise, ID (US); Fatma A. Simsek-Ege, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 14/140,215

(22) Filed: Dec. 24, 2013

(65) Prior Publication Data

US 2015/0179790 A1    Jun. 25, 2015

(51) Int. Cl.
| | |
|---|---|
| H01L 29/788 | (2006.01) |
| H01L 29/66 | (2006.01) |
| H01L 29/423 | (2006.01) |
| H01L 21/28 | (2006.01) |
| H01L 27/115 | (2006.01) |

(52) U.S. Cl.
CPC ... H01L 29/66825 (2013.01); H01L 21/28273 (2013.01); H01L 27/11556 (2013.01); H01L 29/4234 (2013.01)

(58) Field of Classification Search
CPC .......... H01L 29/7827; H01L 29/1033; H01L 29/04; H01L 29/4916; H01L 29/16; H01L 29/788; H01L 29/495; H01L 27/1156; H01L 27/11521; H01L 27/11519; H01L 21/32133; H01L 21/31111; H01L 21/02178; H01L 21/02164
USPC .......................................... 257/316; 438/593
See application file for complete search history.

(56) References Cited

U.S. PATENT DOCUMENTS

| | | | |
|---|---|---|---|
| 2007/0132004 A1 | 6/2007 | Yasuda | |
| 2009/0140317 A1* | 6/2009 | Rosmeulen | ....... H01L 21/28273 257/316 |
| 2010/0097859 A1 | 4/2010 | Shim et al. | |
| 2011/0065270 A1 | 3/2011 | Shim et al. | |
| 2012/0001252 A1 | 1/2012 | Alsmeier | |

(Continued)

FOREIGN PATENT DOCUMENTS

| | | |
|---|---|---|
| KR | 10-2008-0043107 A | 5/2008 |
| KR | 10-2013-0127793 A | 11/2013 |
| TW | I321851 | 3/2010 |
| TW | 201214631 A | 4/2012 |

OTHER PUBLICATIONS

Office Action for U.S. Appl. No. 14/109,230 dated Oct. 30, 2015, 11 pages.

(Continued)

*Primary Examiner* — Trung Q Dang
(74) *Attorney, Agent, or Firm* — Thorpe North & Western, LLP

(57) ABSTRACT

A memory structure having at least substantially aligned floating and control gates. Such a memory structure can include a control gate material disposed between a first insulator layer and a second insulator layer, a floating gate material disposed between the first insulator layer and the second insulator layer and at least substantially aligned with the control gate material, the floating gate material including a metal region, and an interpoly dielectric (IPD) layer disposed between the control gate material and the floating gate material such that the IPD layer electrically isolates the control gate material from the floating gate material.

25 Claims, 7 Drawing Sheets

(56) References Cited

U.S. PATENT DOCUMENTS

| | | | |
|---|---|---|---|
| 2012/0181596 A1* | 7/2012 | Liu | H01L 27/11565 257/316 |
| 2012/0231593 A1 | 9/2012 | Joo et al. | |
| 2012/0267699 A1* | 10/2012 | Kiyotoshi | 257/319 |
| 2013/0001667 A1 | 1/2013 | Lu | |
| 2013/0082316 A1 | 4/2013 | Son et al. | |
| 2013/0307047 A1* | 11/2013 | Sakuma et al. | 257/316 |
| 2014/0160841 A1* | 6/2014 | Koval | 365/185.01 |
| 2014/0203344 A1* | 7/2014 | Hopkins et al. | 257/316 |
| 2015/0041879 A1* | 2/2015 | Jayanti et al. | 257/324 |

OTHER PUBLICATIONS

Search Report for International application PCT/US2014/065957, mailing date Feb. 24, 2015, 10 pages.

Search Report for International application PCT/US2014/067134, mailing date Feb. 26, 2015, 10 pages.

U.S. Appl. No. 14/109,230, filed Dec. 17, 2013, John D. Hopkins.

\* cited by examiner

MEMORY STRUCTURE WITH SELF-ALIGNED FLOATING AND CONTROL GATES AND ASSOCIATED METHODS

BACKGROUND

Memory structures are integrated circuits that provide data storage to a variety of electronics devices. Memory can include volatile memory structures that lose stored information when not powered (e.g., RAM-Random Access Memory), and non-volatile memory structures that retain stored information even when not powered. One example of such non-volatile memory is flash memory. Non-volatile flash memory can be used in a variety of portable devices, and can be beneficial for use when transferring data from one electronic device to another where power is not supplied during the physical transfer.

DESCRIPTION OF EMBODIMENTS

Figure 1:
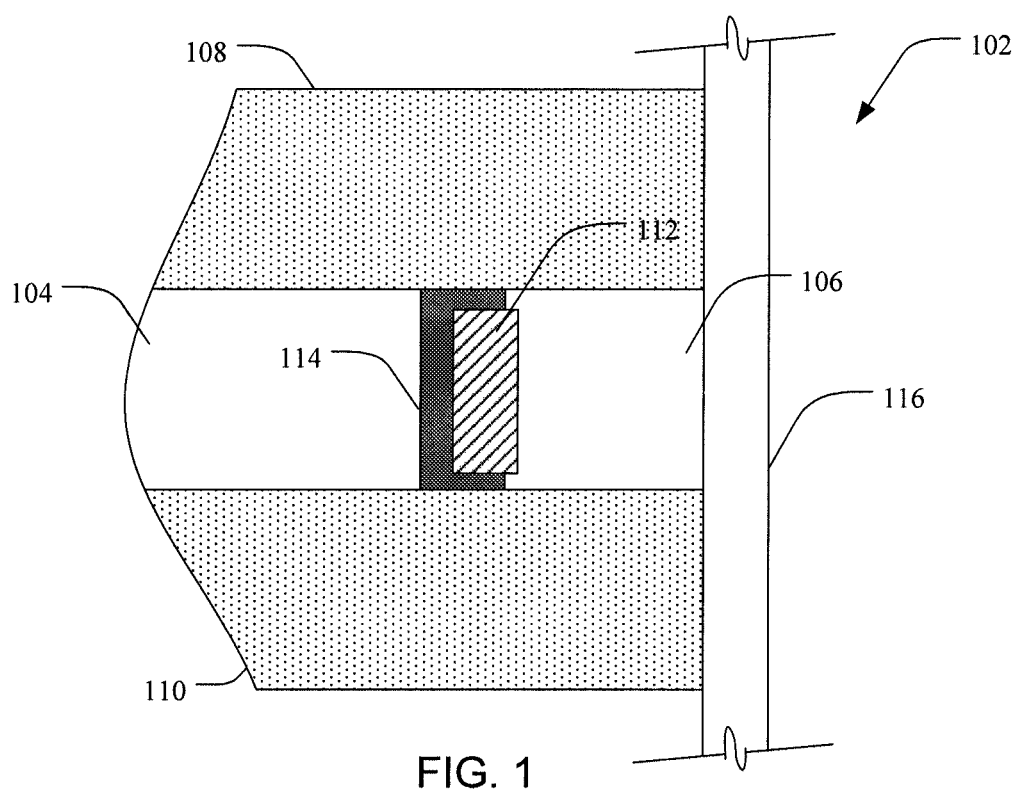
FIG. 1 is a schematic view of a section of a memory structure in accordance with an invention embodiment.

Although the following detailed description contains many specifics for the purpose of illustration, a person of ordinary skill in the art will appreciate that many variations and alterations to the following details can be made and are considered to be included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

EXAMPLE EMBODIMENTS

An initial overview of technology embodiments is provided below and specific technology embodiments are then described in further detail. This initial summary is intended to aid readers in understanding the technology more quickly but is not intended to identify key or essential features of the technology, nor is it intended to limit the scope of the claimed subject matter.

3D NAND memory generally includes a plurality of memory cells that include floating-gate transistors. Present 3D NAND memory cells can include a plurality of NAND memory structures arranged in three dimensions around a central cell pillar. A memory structure can generally include a floating gate that is electrically isolated from a supporting semiconductor substrate by a thin dielectric layer called a tunnel dielectric layer. A conductive material (the control gate) is positioned adjacent to the floating gate and electrically isolated therefrom by an inter-poly dielectric (IPD) layer. The inter-poly dielectric can be a layered structure, and in some aspects can include a silicon nitride layer sandwiched between two layers of silicon oxide. The floating gate is generally comprised of a conductive material that serves as a charge storage element for electrical charge. This charge storage element defines the memory state of the particular transistor to which it is associated. The floating gate is electrically isolated from surrounding conductive materials, and thus charge stored therein remains even when power to the device is discontinued.

One issue that can arise in the manufacture of NAND memory structures relates to the alignment of the floating gate to the control gate. Misalignment between these gates can negatively affect the performance and reliability of the device. As the size of the NAND memory structure decreases, alignment between the floating gate and the control gate can become more challenging. As such, self-alignment of the floating gate with the control gate can increase performance and reliability of the device, and in many cases can be scaled down with the decreasing size of memory devices.

Accordingly, in one aspect as is shown in FIG. 1, a memory structure 102 having at least substantially aligned floating and control gates is provided. The memory structure can include a control gate 104 and a floating gate material 106 disposed between a first insulating layer 108 and a second insulating layer 110. The floating gate 106 is aligned or at least substantially aligned with the control gate 104. A metal region 112 is positioned between the control gate 104 and the floating gate 106. An interpoly dielectric (IPD) layer 114 is disposed between the floating gate 106 and the control gate 104 such that the IPD layer 114 electrically isolates the control gate 104 from the floating gate 106. Furthermore, the metal region 112 is positioned between the IPD layer 114 and the floating gate 106. A tunnel dielectric 116 can be formed at the floating gate 106 opposite the control gate 104. The floating gate 106 is aligned with the control gate 104 along the sides of the first insulating layer 108 and the second insulating layer 110. When the floating gate 106 is formed it is self-aligned to the height of the associated control gate 104, thus increasing the floating gate to control gate coupling.

Such a memory structure can be used as a single NAND device, or the memory structure can be incorporated into a device that includes a plurality of such structures. Furthermore, the particular architectural layouts described herein should not be seen as limiting, and it is to be understood that other architectures are contemplated for integrating a plurality of such memory structures into a device.

Figure 2:
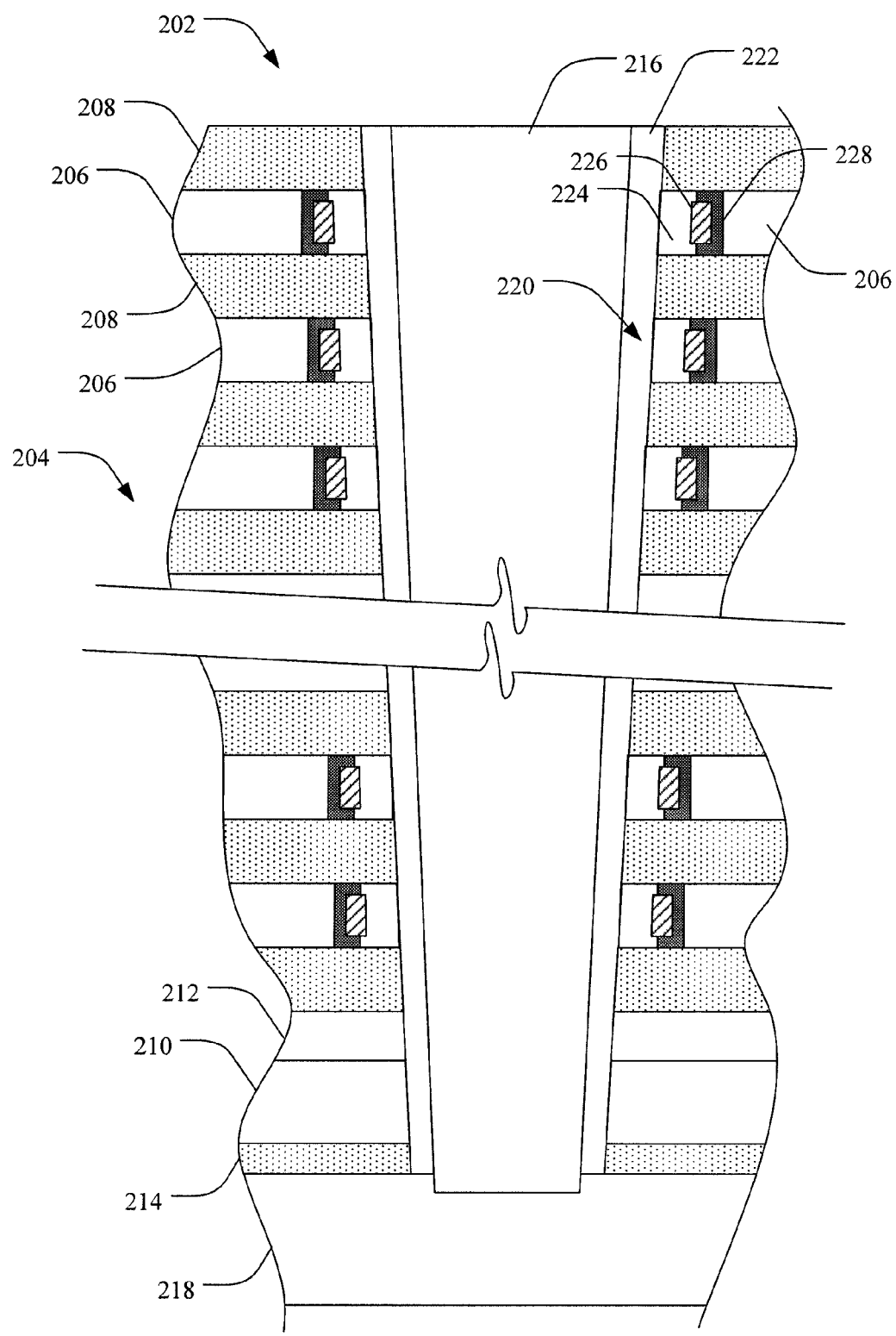
FIG. 2 is a schematic view of a section of a 3D NAND memory cell in accordance with an invention embodiment.

In one aspect, as is shown in FIG. 2 for example, a 3D NAND memory structure 202 having at least substantially aligned floating and control gates is provided. Such a memory structure can include a cell stack substrate 204 having alternating layers of conducting 206 and insulating 208 materials disposed on a select gate source (SGS) region 210. In some aspects, the SGS region is disposed between an etch stop layer 212 and an additional insulating layer 214. A cell pillar 216 can be positioned within the cell stack substrate 204 in a substantially perpendicular orientation with respect to the plurality of alternating layers 206, 208. The cell pillar extends through the SGS region 210 into an underlying source layer 218. A plurality of NAND memory structures 220 are arranged in a three dimensional configuration around the cell pillar 216. The plurality of NAND memory structures 220 are aligned with the conductive material layers 206 of the cell stack substrate 204. In one aspect the conductive material layers 206 can function as control gate material, while in other aspects a separate control gate material can be positioned between the conductive material layer and the NAND memory structure. In another aspect, the plurality of memory structures can be arranged in columns around the cell pillar.

A tunnel dielectric material 222 can be positioned between the cell stack substrate 204 and the cell pillar 216, thus electrically isolating the NAND memory structures 220 from the cell pillar 216 and from one another. Each NAND memory structure includes a floating gate 224 disposed between insulating material layers 208 and aligned with a conducting material layer 206 (i.e. a control gate). The floating gate 224 and the control gate or conducting material layer 206 are aligned along edges of the insulating material layers 208. An interpoly dielectric (IPD) layer 228 is disposed between the floating gate 224 and the conductive material layer 206 such that the IPD layer 228 electrically isolates the conductive material layer 206 from the floating gate material 224. A metal layer 226 is positioned between the IPD layer 228 and the floating gate material 224.

It has been discovered that inclusion of a metal in the floating gate allows significant reduction in gate size without risking depletion. In one aspect, the floating gate may be reduced by up to about 70%. In another aspect, the floating gate may be reduced in size by from about 30% to about 60%. In terms of measurement, in some aspects, the floating gate may be reduced from about 10 nm to about 3 nm. In a further aspect, the floating gate may have a size of from about 3 nm to about 5 nm. Each size may be achieved without significant risk of depletion by inclusion of a metal in the floating gate. In one aspect, the amount of metal in the floating gate may be a layer of at least 1 nm. In another aspect, it may be a layer of from about 1 nm to about 3 nm. In another aspect, the metal layer may be nano dots.

Figure 3:
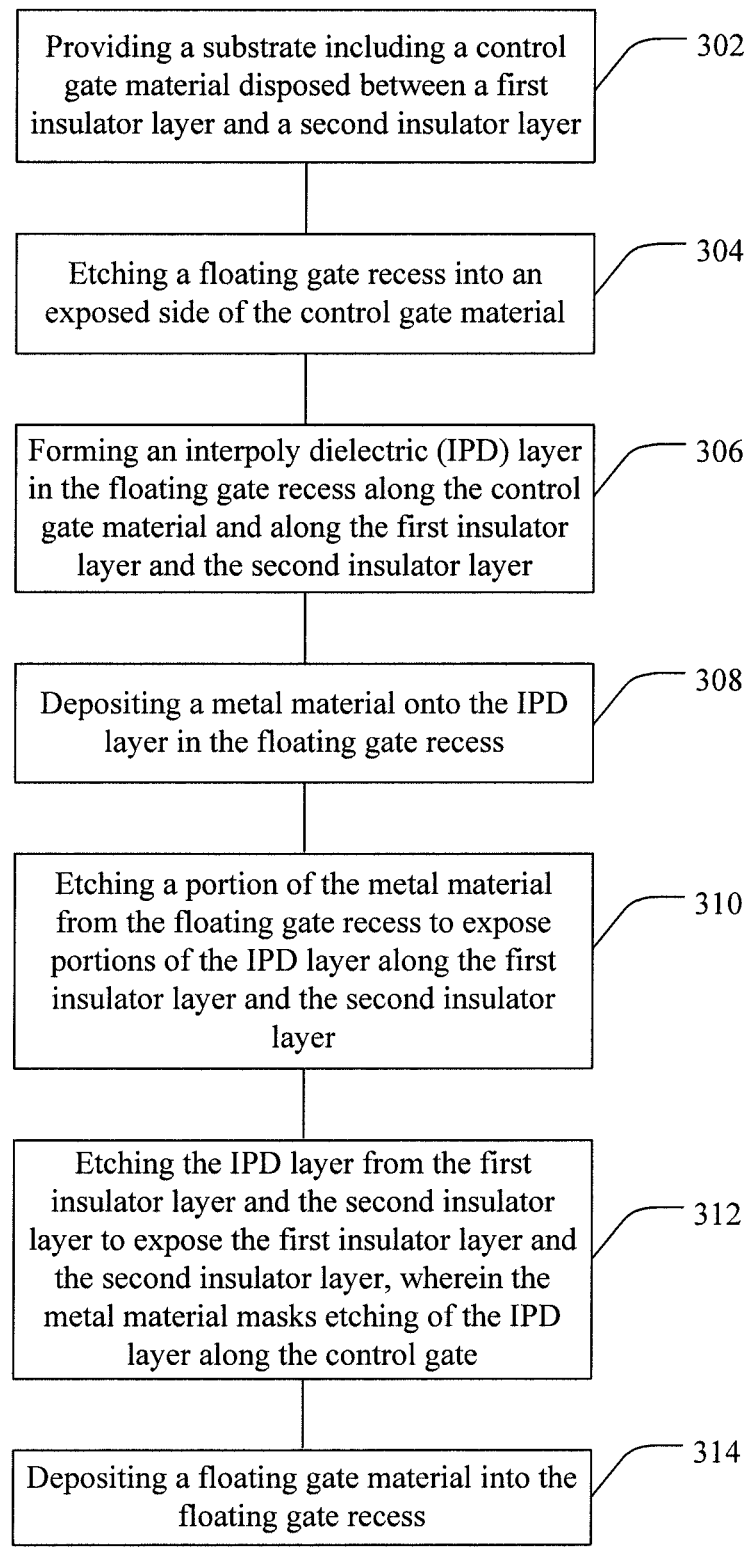
FIG. 3 is a flow diagram of a method of making a memory structure in accordance with an invention embodiment.

In another aspect, a method of making a memory structure having aligned floating and control gates is provided. As is shown in FIG. 3, such a method can include 302 providing a substrate including a control gate material disposed between a first insulator layer and a second insulator layer, 304 etching a floating gate recess into an exposed side of the control gate material, and 306 forming an interpoly dielectric (IPD) layer in the floating gate recess along the control gate material and along the first insulator layer and the second insulator layer. The method can further include 308 depositing a metal material onto the IPD layer in the floating gate recess, 310 etching a portion of the metal material from the floating gate recess to expose portions of the IPD layer along the first insulator layer and the second insulator layer. 312 etching the IPD layer from the first insulator layer and the second insulator layer to expose the first insulator layer and the second insulator layer, wherein the metal material masks etching of the IPD layer along the control gate, and 314 depositing a floating gate material into the floating gate recess.

Figure 4A:
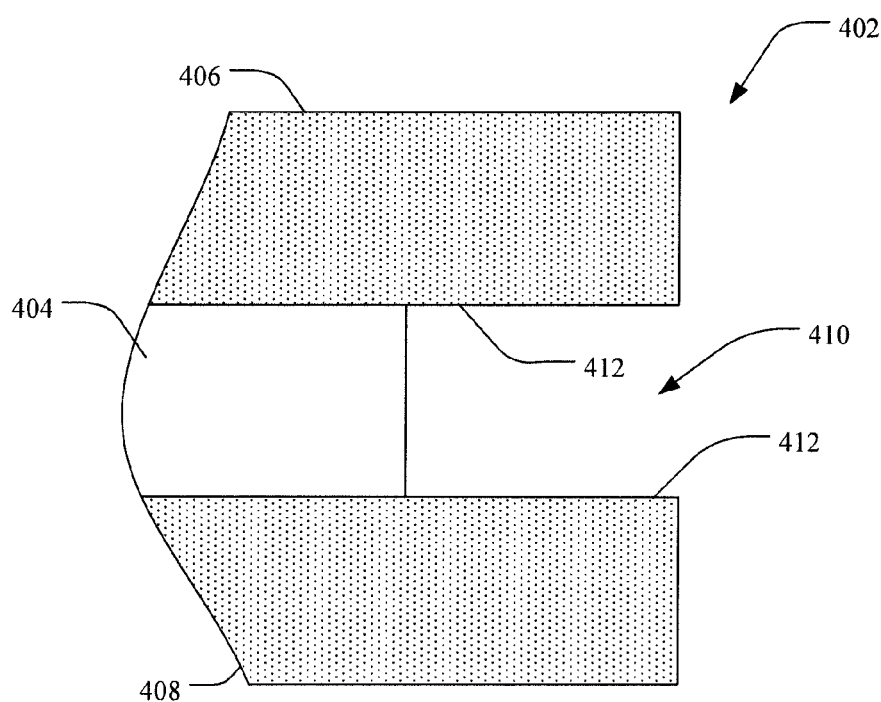
FIG. 4A is a schematic view of a section of a memory structure during manufacture in accordance with an invention embodiment.

In another aspect, as is shown in FIG. 4A, a memory structure 402 is shown in the process of being made. The memory structure 402 can include a control gate material 404 disposed between a first insulator layer 406 and a second insulator layer 408. A floating gate recess 410 is etched into the control gate material 404 in between the first insulator layer 406 and the second insulator layer 408. It is noted that the etch process used to form the floating gate recess 410 can be any known technique capable of selectively etching the control gate material 404 from in between the insulator layers while leaving the edges 412 of the insulator layers at least substantially intact. Such techniques are well known, non-limiting examples of which include a buffered oxide etch or HF for decapping etch followed with tetramethylammonium hydroxide (TMAH) or NH4OH, Vapor HF/Vapor NH3 and the like.

Figure 4B:
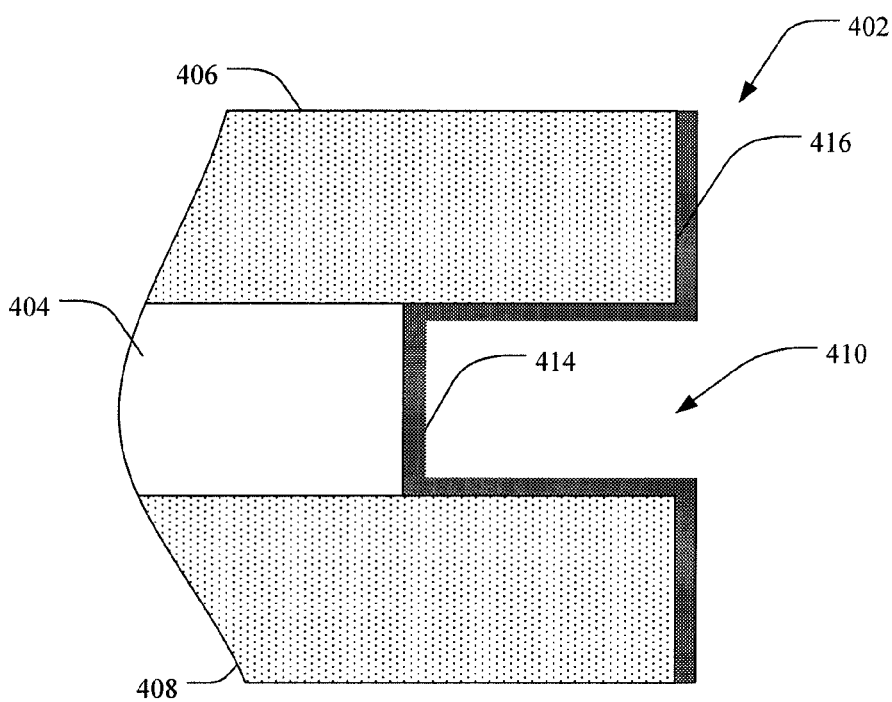
FIG. 4B is a schematic view of a section of a memory structure during manufacture in accordance with an invention embodiment.

FIG. 4B shows an interpoly dielectric (IPD) layer 414 formed along the exposed sides of the floating gate recess 410. In some aspects the IPD layer 414 is also formed along the sidewalls of the substrate 416 (e.g. a cell pillar trench) into which the floating gate recess 410 is formed. The IPD layer can be made of any known material useful for such a material. In one aspect the IPD layer can be a layered structure comprised of a silicon nitride layer disposed between two layers of silicon oxide. This tri-layer is known in the art as an "ONO" or "Oxide-Nitride-Oxide" layer. Note that the IPD layer 414 is positioned to electrically isolate materials subsequently deposited into the floating gate recess 410 from the control gate material 404.

Figure 4C:
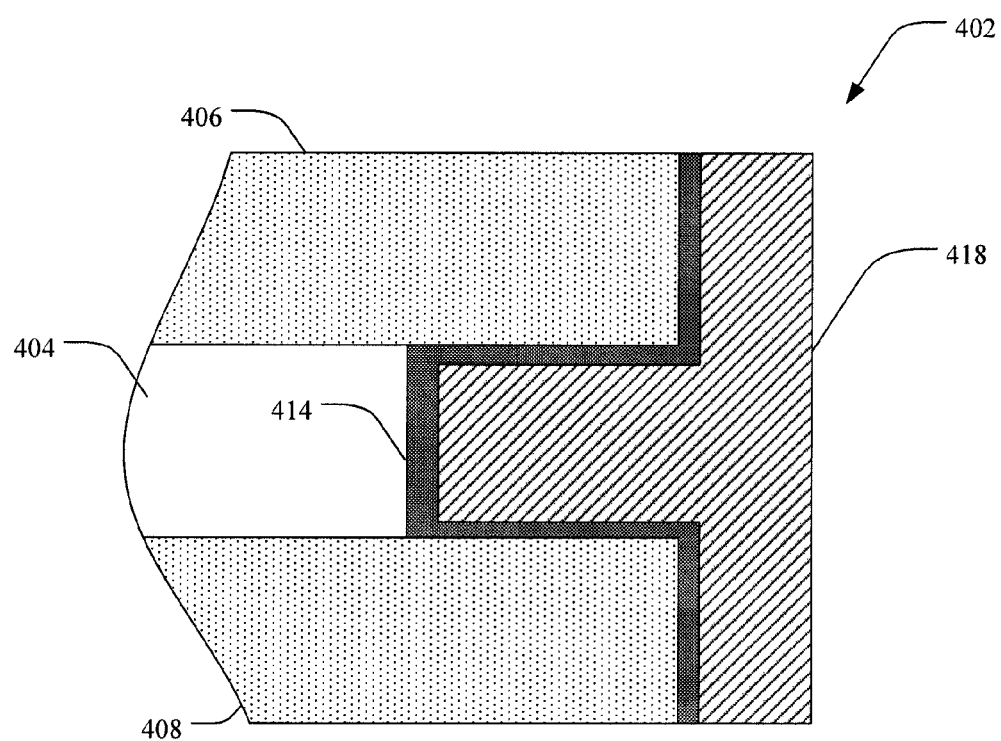
FIG. 4C is a schematic view of a section of a memory structure during manufacture in accordance with an invention embodiment.

A metal material 418 is shown deposited on the IPD layer 414 in the floating gate recesses 410 as is shown in FIG. 4C. The metal material can be deposited to completely fill the floating gate recess 410 as shown, or the metal material can be deposited onto the IPD layer to a specific thickness. The metal material can be any metal material having beneficial properties in the manufacture or use of a NAND memory cell or structure. In one aspect, the metal layer can be a metal nitride. In another aspect, non-limiting examples of metal layer material can include TiN, TiCN, TaN, TiSiN, WSix, RuTiN, RuO$_x$, TaSiN, TaCON, TiCON, W$_x$N$_x$ and the like, including appropriate combinations thereof. In yet another aspect, the metal layer can be TiN. While the thickness of the metal layer can vary depending on the architecture of the device, in one aspect the metal layer can have a thickness of from about 1 nm to about 6 nm. In another aspect, the metal material can have a thickness of from about 15% to about 70% of the thickness of the control gate material 404. Additionally, the metal material can be formed according to any known technique, including, without limitation, chemical vapor deposition, physical vapor deposition, atomic layer deposition, and the like.

Figure 4D:
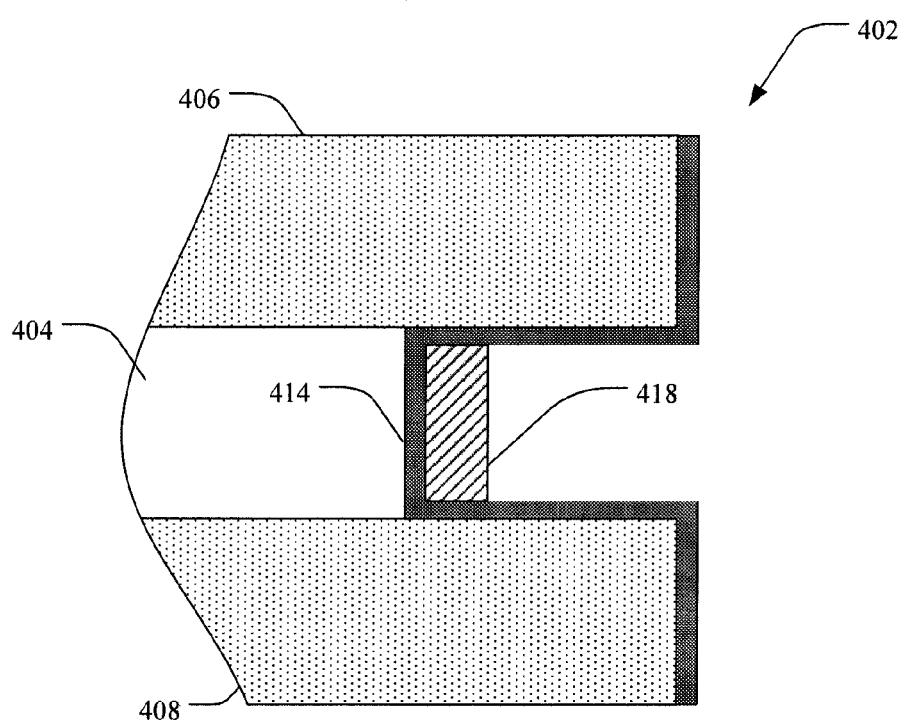
FIG. 4D is a schematic view of a section of a memory structure during manufacture in accordance with an invention embodiment.

A portion of the metal material 418 is then removed from the floating gate recess 410 to expose portions of the IPD layer 414 along the first insulator layer 406 and the second insulator layer 408, as is shown in FIG. 4D. The metal material can be removed by any process capable of selectively removing the metal material. Non-limiting examples of such processes include NH$_4$OH/H$_2$O$_2$, NH$_4$OH/O$_3$, Hot Phosphoric Acid, HF/O$_3$, HF/H$_2$O$_2$, HF Vapor, NH$_3$ Vapor, H$_2$SO$_4$/H$_2$O$_2$, HF/HNO$_3$, and the like, including appropriate combinations thereof. In one specific aspect, etching the portion of the metal material further includes etching the metal material with an NH$_4$OH/H$_2$O$_2$ mixture. In one aspect, the metal material 418 is separated from each of the first insulator layer 406 and the second insulator layer 408 by a portion of the IPD layer 414.

Figure 4E:
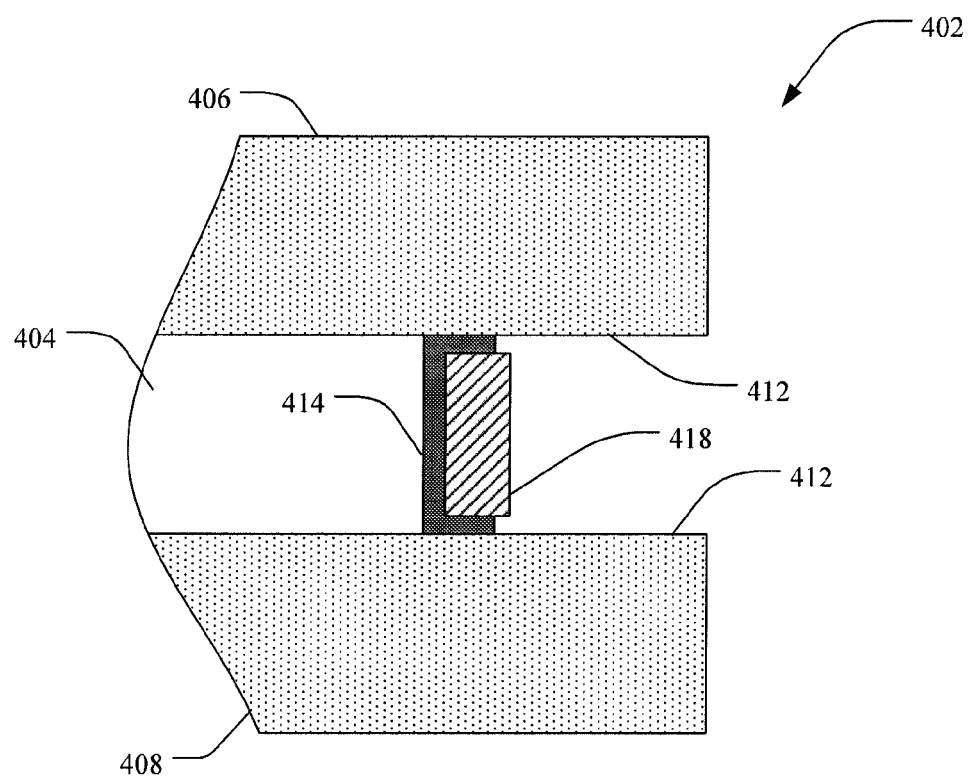
FIG. 4E is a schematic view of a section of a memory structure during manufacture in accordance with an invention embodiment.
Figure 4F:
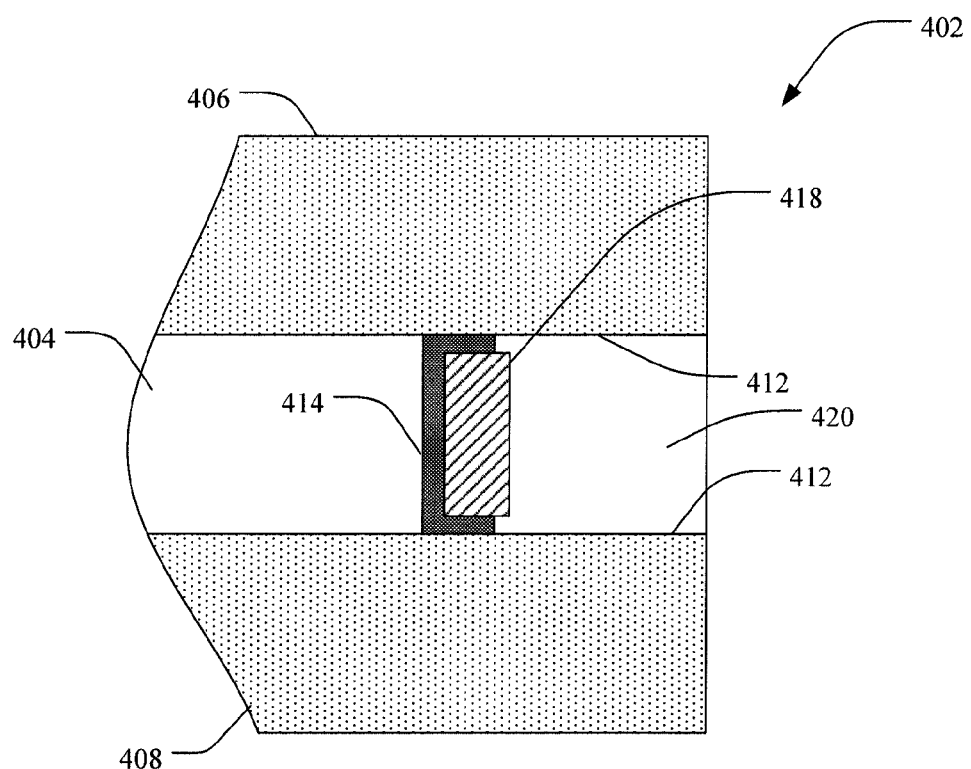
FIG. 4F is a schematic view of a section of a memory structure during manufacture in accordance with an invention embodiment.

As is shown in FIG. 4E, the IPD layer 414 is etched from the floating gate recess 410 back to the metal material 418 to expose the first insulator layer 406 and the second insulator layer 408. In this case the metal region 418 acts a blocking material to allow the IPD layer to be selectively removed from the edges 412 of the insulator layers while maintaining the IPD layer 414 between the control gate material 404 and the metal material 418. The IPD layer can be etched using any known process that selectively removes the IPD material while leaving the metal material 418 and the edges 412 of the first insulating layer 406 and the second insulating layer 408 at least substantially intact. Non-limiting examples of such etch processes can include hydrogen fluoride, Hot Phosporic Acid, $HF/O_3$, $HF/H_2O_2$, HF Vapor, $NH_3$ Vapor, $H_2SO_4/H_2O_2$, $HF/HNO_3$, and the like, including appropriate combinations thereof. In one specific aspect, the IPD layer is etched from the first insulator layer and the second insulator with hydrogen fluoride Following etching of the flanking regions of the IPD layer 414, the floating gate recess can be filled with a floating gate material to form a floating gate 420. The floating gate 420 is self-aligned to the control gate material 404 during manufacture due to the exposed edges 412 of the insulator layers. The control gate material 404 and the floating gate 420 both fill the space between the insulator layers 406, 408, and are aligned along the edges 412, and as such have a good coupling ratio. Such an increase coupling allows the architecture of the memory structure to be smaller as compared to a device having a decreased or less accurate alignment. In aspects whereby a plurality of memory structures are incorporated into a memory cell structure, effective alignment of the control gates and floating gates in each memory structure can greatly reduce the size of the memory cell device. It is noted that the floating gate material can be any material useful in creating a floating gate. In one specific aspect, the floating gate material can be polysilicon.

As is shown in FIG. 4E, in one aspect the control gate material 404 is in direct contact with the IPD layer 414, the IPD layer 414 is in direct contact with the metal material 418, and the metal material 418 is in direct contact with the floating gate 420. Additionally, in a further aspect the floating gate 420 is in direct contact with the IPD layer 414. In another aspect, the floating gate 420 is in direct contact with each of the first insulator layer 406 and the second insulator layer 408. Furthermore, in one aspect the floating gate 420 and the control gate material 404 are at least substantially aligned along planes formed by boundaries of the first insulator layer 406 and the second insulator layer 408.

Various etching techniques can be used depending on the nature of the material to be etched and the nature of any etch stop used in a given etch process. Generally, various wet and dry cleaning methods are known in the art. In some exemplary aspects, a conventional wet DHF (dilute hydrofluoric acid) etching or cleaning etch process can be used. In other aspects, a dry etching or cleaning process can be used such as, without limitation, a plasma-free gas chemical etch system targeted at selective oxide film etching using a Certas machine available from Tokyo Electron Limited (TEL) of Japan, or a SiCoNi etching process using a machine from Applied Materials of Santa Clara, Calif. using HF+NH3 vapor/HF+NH3 plasma. In one specific aspect, a given material can be etched with TMAH (Tetramethylammonium hydroxide) from 0.1% to 10% in the temperature of 10 C to 100 C using a Certas machine. One exemplary chemistry includes <10% TMAH, <2% of a nonionic surfactant, pH buffers for a range of 8-10, and optional chelating and/or complexing agents.

In the case of a TiN metal layer, for example, an SC1 chemistry can be useful. SC1 chemistries are well known, and often include a solution of $NH_4OH$, $H_2O_2$, and deionized water. One exemplary chemistry includes 28% $NH_4OH$, 30% $H_2O_2$, and dionized water in a 1:1:5 ratio at 70 C. In another aspect, an APM etch can be utilized. The composition of APM can also be expressed as 0.2:1.0 wt %. That is 0.2 wt % NH4OH and 1.0 wt % H2O2 with the remaining composed of deionized water. Note that the metal layer etch is selective to the metal layer, and thus exposes the IPD layer in the floating gate recess. Another option is PIRANHA which is typically composed of H2O2 (1 part) and H2SO4 (10 parts) running at 120 C. In another aspect, Piranha will also etch TiN.

Figure 5:
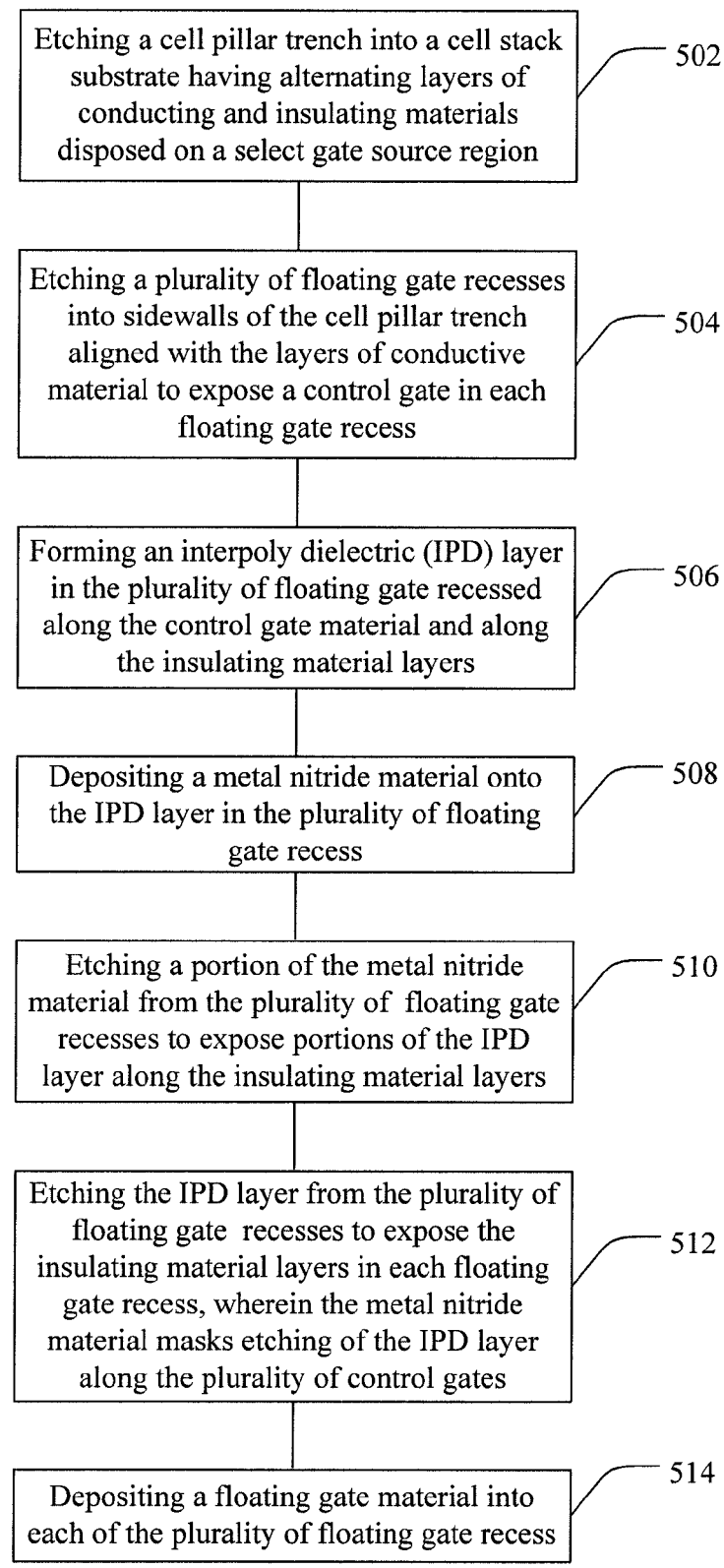
FIG. 5 is a schematic view of a section of a 3D NAND memory cell in accordance with an invention embodiment.

In another aspect, as is shown in FIG. 5, a method of making a 3D NAND memory structure or device, sometimes referred to as a memory cell, having aligned floating and control gates is provided. Such a method can include 502 etching a cell pillar trench into a cell stack substrate having alternating layers of conducting and insulating materials disposed on a select gate source region, 504 etching a plurality of floating gate recesses into sidewalls of the cell pillar trench aligned with the layers of conductive material to expose a control gate in each floating gate recess, 506 forming an interpoly dielectric (IPD) layer in the plurality of floating gate recessed along the control gate material and along the insulating material layers, and 508 depositing a metal nitride material onto the IPD layer in the plurality of floating gate recess. The method can further include 510 etching a portion of the metal nitride material from the plurality of floating gate recesses to expose portions of the IPD layer along the insulating material layers, 512 etching the IPD layer from the plurality of floating gate recesses to expose the insulating material layers in each floating gate recess, wherein the metal nitride material masks etching of the IPD layer along the plurality of control gates, and 514 depositing a floating gate material into each of the plurality of floating gate recess.

As has been described, a tunnel dielectric can then be formed along the sidewalls of the trench. Tunnel dielectrics are well known, and can be any insulating material that functions as a tunnel dielectric. Non-limiting examples can include oxides and nitrides such as Si02, SiON, and the like. In one aspect the tunnel dielectric can be an oxide that has been treated to allow uniform growth on metal materials. In one specific aspect the tunnel dialectic can be a DEP poly liner (30A) that has been in situ steam generation (ISSG) oxidized. Following formation of the tunnel dielectric, a liner layer can be formed on the tunnel dialectic and the bottom of the cell pillar trench can be punch-etched through the liner layer and the tunnel dielectric to expose the source layer. A cell pillar can subsequently be deposited into and thus fill the cell pillar trench as is shown in FIG. 2. In one non-limiting aspect, the cell pillar can be a polysilicon material.

Resulting devices can demonstrate a variety of improved performance characteristics, which can be attributed, at least in part, to the presence of the metal layer/floating gate composite material, or to the improved accuracy of alignment between the floating gate and control gate. For example, the addition of a metal can reduce or prevent the polysilicon in the floating gate from becoming depleted, which can happen, particularly when a polysilicon floating gate is less than 6 nm. Further, the benefit of the presence of the metal increases as the polysilicon gate gets smaller. In addition, the improved accuracy of alignment of the control and floating gates can improve program slope by between about 100 mV and about 200 mV.

In one example, a memory structure having at least substantially aligned floating and control gates, can include a control gate material disposed between a first insulator layer and a second insulator layer; a floating gate material disposed between the first insulator layer and the second insulator layer and at least substantially aligned with the control gate material, the floating gate material including a metal region; and an interpoly dielectric (IPD) layer disposed between the control gate material and the floating gate material such that the IPD layer electrically isolates the control gate material from the floating gate material.

In one example, the metal region is positioned between the floating gate material and the IPD layer.

In one example, the metal region is separated from each of the first insulator layer and the second insulator layer by a portion of the IPD layer.

In one example, the control gate material is in direct contact with the IPD layer, the IPD layer is in direct contact with the metal region, and the metal region is in direct contact with the floating gate material.

In one example, the floating gate material is in direct contact with the IPD layer.

In one example, the floating gate material is in direct contact with each of the first insulator layer and the second insulator layer.

In one example, the floating gate material and the control gate material are at least substantially aligned along planes formed by boundaries of the first insulator layer and the second insulator layer.

In one example, the metal material includes a material selected from the group consisting of TiN, TiCN, TaN, TiSiN, WSix, RuTiN, RuOx, TaSiN, TaCON, TiCON, and combinations thereof.

In one example, the metal material includes TiN.

In one example, the metal material consists essentially of TiN.

In one example, the metal region has a thickness of from about 1 nm to about 6 nm.

In one example, the metal region has a thickness of from about 15% to about 30% of the control gate material thickness.

In one example, a 3D NAND memory cell having at least substantially aligned floating and control gates, can include a cell stack substrate having alternating layers of conductor and insulator materials disposed on a select gate source region; a cell pillar positioned within the cell stack substrate in a substantially perpendicular orientation with respect to the plurality of alternating layers; and a plurality of memory structures as recited herein arranged in a three dimensional configuration around a cell pillar, wherein the plurality of memory structures are aligned with and electrically coupled to the conductor material layers.

In one example, the plurality of memory structures are arranged in columns around the cell pillar.

In one example, the floating gates range in size from about 3 nm to about 10 nm.

In one example, a method of making a memory structure having aligned floating and control gates, may include providing a substrate including a control gate material disposed between a first insulator layer and a second insulator layer; etching a floating gate recess into an exposed side of the control gate material; forming an interpoly dielectric (IPD) layer in the floating gate recess along the control gate material and along the first insulator layer and the second insulator layer; depositing a metal material onto the IPD layer in the floating gate recess; etching a portion of the metal material from the floating gate recess to expose portions of the IPD layer along the first insulator layer and the second insulator layer; etching the IPD layer from the first insulator layer and the second insulator layer to expose the first insulator layer and the second insulator layer, wherein the metal material masks etching of the IPD layer along the control gate; and depositing a floating gate material into the floating gate recess.

In one example, depositing the metal material onto the IPD layer in the floating gate recess further includes filling at least substantially all of the floating gate recess with the metal material.

In one example, etching the portion of the metal material further includes etching the metal material with an etchant selected from the group consisting of NH4OH/H2O2, NH4OH/O3, hot phosphoric acid, HF/O3, HF/H2O2, HF Vapor, NH3 Vapor, H2SO4/H2O2, or HF/HNO3.

In one example, etching the portion of the metal material further includes etching the metal material with an NH4OH/H2O2 mixture.

In one example, etching the IPD layer from the first insulator layer and the second insulator layer further includes etching with a technique selected from the group consisting of hydrogen fluoride, hot phosporic acid, HF/O3, HF/H2O2, HF Vapor, NH3 Vapor, H2SO4/H2O2, or HF/HNO3.

In one example, etching the IPD layer from the first insulator layer and the second insulator layer further includes etching with hydrogen fluoride.

In one example, the metal material includes a material selected from the group consisting of TiN, TiCN, TaN, TiSiN, WSix, RuTiN, RuOx, TaSiN, TaCON, TiCON, and combinations thereof.

In one example, the metal material includes TiN.

In one example, the metal material has a thickness of from about 1 nm to about 6 nm.

In one example, the metal material has a thickness of from about 15% to about 30% of the control gate material thickness.

In one example, a method of making a 3D NAND memory cell or device having aligned floating and control gates, can include etching a cell pillar trench into a cell stack substrate having alternating layers of conducting and insulating materials disposed on a select source gate region; etching a plurality of floating gate recesses into sidewalls of the cell pillar trench aligned with the layers of conductive material to expose a control gate in each floating gate recess; forming an interpoly dielectric (IPD) layer in the plurality of floating gate recessed along the control gate material and along the insulating material layers; depositing a metal material onto the IPD layer in the plurality of floating gate recess; etching a portion of the metal material from the plurality of floating gate recesses to expose portions of the IPD layer along the insulating material layers; etching the IPD layer from the plurality of floating gate recesses to expose the insulating material layers in each floating gate recess, wherein the metal material masks etching of the IPD layer along the plurality of control gates; and depositing a floating gate material into each of the plurality of floating gate recess.

In one example, depositing the metal material onto the IPD layer in plurality of floating gate recesses further includes filling at least substantially all of the floating gate recess with the metal material in each of the floating gate recesses.

In one example, etching the portion of the metal material further includes etching the metal material with an etchant selected from the group consisting of NH4OH/H2O2, NH4OH/O3, hot phosphoric acid, HF/O3, HF/H2O2, HF Vapor, NH3 Vapor, H2SO4/H2O2, or HF/HNO3.

In one example, etching the portion of the metal material further includes etching the metal material with an NH4OH/H2O2 mixture.

In one example, etching the IPD layer from the first insulator layer and the second insulator layer further includes etching with a technique selected from the group consisting of hydrogen fluoride, Hot Phosporic Acid, HF/O3, HF/H2O2, HF Vapor, NH3 Vapor, H2SO4/H2O2, or HF/HNO3.

In one example, forming the IPD layer in the plurality of floating gate recesses further includes forming the IPD along the sidewalls of the cell pillar trench; depositing the metal material onto the IPD layer in the plurality of floating gate recesses further includes depositing the metal material along the sidewalls of the cell pillar trench; and depositing the floating gate material in the plurality of floating gate recesses depositing the floating gate material onto the sidewalls of the cell pillar trench following etching away of the metal material and the IPD layer.

In one example, a method as recited herein may include forming a tunnel dielectric layer along the sidewalls of the cell pillar trench; forming a liner layer on the tunnel dielectric layer along the sidewalls of the cell pillar trench; punch etching a bottom side of the cell pillar trench through the liner layer and the tunnel dielectric layer to expose a source layer of the substrate; and filling the cell pillar trench with a polysilicon material to form a cell pillar.

In one example, the metal material includes a material selected from the group consisting of TiN, TiCN, TaN, TiSiN, WSix, RuTiN, RuOx, TaSiN, TaCON, TiCON, and combinations thereof.

In one example, the metal material includes TiN.

While the forgoing examples are illustrative of the specific embodiments in one or more particular applications, it will be apparent to those of ordinary skill in the art that numerous modifications in form, usage and details of implementation can be made without departing from the principles and concepts articulated herein. Accordingly, no limitation is intended except as by the claims set forth below.

What is claimed is:

1. A memory structure having at least substantially aligned floating and control gates, comprising:
    a control gate material disposed between a first insulator layer and a second insulator layer;
    a floating gate material disposed between, and in direct contact with, each of the first insulator layer and the second insulator layer and at least substantially aligned with the control gate material, the floating gate material including a metal region;
    an interpoly dielectric (IPD) layer disposed between the control gate material and the floating gate material such that the IPD layer electrically isolates the control gate material from the floating gate material.

2. The memory structure of claim 1, wherein the metal region is positioned between the floating gate material and the IPD layer.

3. The memory structure of claim 2, wherein the metal region is separated from each of the first insulator layer and the second insulator layer by a portion of the IPD layer.

4. The memory structure of claim 2, wherein the control gate material is in direct contact with the IPD layer, the IPD layer is in direct contact with the metal region, and the metal region is in direct contact with the floating gate material.

5. The memory structure of claim 4, wherein the floating gate material is in direct contact with the IPD layer.

6. The memory structure of claim 1, wherein the floating gate material and the control gate material are at least substantially aligned along planes formed by boundaries of the first insulator layer and the second insulator layer.

7. The memory structure of claim 1, wherein the metal material includes a material selected from the group consisting of TiN, TiCN, TaN, TiSiN, WSix, RuTiN, RuOx, TaSiN, TaCON, TiCON, and combinations thereof.

8. The memory structure of claim 1, wherein the metal material includes TiN.

9. The memory structure of claim 1, wherein the metal region has a thickness of from about 1 nm to about 6 nm.

10. The memory structure of claim 1, wherein the metal region has a thickness of from about 15% to about 30% of the control gate material thickness.

11. A method of making a memory structure having aligned floating and control gates, comprising:
    providing a substrate including a control gate material disposed between a first insulator layer and a second insulator layer;
    etching a floating gate recess into an exposed side of the control gate material; forming an interpoly dielectric (IPD) layer in the floating gate recess along the control gate material and along the first insulator layer and the second insulator layer;
    depositing a metal material onto the IPD layer in the floating gate recess; etching a portion of the metal material from the floating gate recess to expose portions of the IPD layer along the first insulator layer and the second insulator layer;
    etching the IPD layer from the first insulator layer and the second insulator layer to expose the first insulator layer and the second insulator layer, wherein the metal material masks etching of the IPD layer along the control gate; and
    depositing a floating gate material into the floating gate recess.

12. The method of claim 11, wherein depositing the metal material onto the IPD layer in the floating gate recess further includes filling at least substantially all of the floating gate recess with the metal material.

13. The method of claim 11, wherein etching the portion of the metal material further includes etching the metal material with an etchant selected from the group consisting of NH4OH/H2O2, NH4OH/O3, Hot Phosphoric Acid, HF/O3, HF/H2O2, HF Vapor, NH3 Vapor, H2SO4/H2O2, or HF/HNO3.

14. The method of claim 11, wherein etching the portion of the metal material further includes etching the metal material with an NH4OH/H2O2 mixture.

15. The method of claim 11, wherein etching the IPD layer from the first insulator layer and the second insulator layer further includes etching with a technique selected from the group consisting of hydrogen fluoride, Hot Phosporic Acid, HF/O3, HF/H2O2, HF Vapor, NH3 Vapor, H2SO4/H2O2, or HF/HNO3.

16. The method of claim 11, wherein etching the IPD layer from the first insulator layer and the second insulator layer further includes etching with hydrogen fluoride.

17. The method of claim 11, wherein the metal material includes a material selected from the group consisting of TiN, TiCN, TaN, TiSiN, WSix, RuTiN, RuOx, TaSiN, TaCON, TiCON, and combinations thereof.

18. The method of claim 11, wherein the metal material includes TiN.

19. The method of claim 11, wherein the metal material has a thickness of from about 1 nm to about 6 nm.

20. The method of claim 11, wherein the metal material has a thickness of from about 15% to about 30% of the control gate material thickness.

21. A method of making a 3D NAND memory device having aligned floating and control gates, comprising:

etching a cell pillar trench into a cell stack substrate having alternating layers of conducting and insulating materials disposed on a select source gate region;

etching a plurality of floating gate recesses into sidewalls of the cell pillar trench aligned with the layers of conductive material to expose a control gate in each floating gate recess;

forming an interpoly dielectric (IPD) layer in the plurality of floating gate recessed along the control gate material and along the insulating material layers;

depositing a metal material onto the IPD layer in the plurality of floating gate recess;

etching a portion of the metal material from the plurality of floating gate recesses to expose portions of the IPD layer along the insulating material layers;

etching the IPD layer from the plurality of floating gate recesses to expose the insulating material layers in each floating gate recess, wherein the metal material masks etching of the IPD layer along the plurality of control gates; and depositing a floating gate material into each of the plurality of floating gate recess.

22. The method of claim 21, wherein:

forming the IPD layer in the plurality of floating gate recesses further includes forming the IPD along the sidewalls of the cell pillar trench;

depositing the metal material onto the IPD layer in the plurality of floating gate recesses further includes depositing the metal material along the sidewalls of the cell pillar trench; and depositing the floating gate material in the plurality of floating gate recesses depositing the floating gate material onto the sidewalls of the cell pillar trench following etching away of the metal material and the IPD layer.

23. The method of claim 21, further comprising:

forming a tunnel dielectric layer along the sidewalls of the cell pillar trench;

forming a liner layer on the tunnel dielectric layer along the sidewalls of the cell pillar trench;

punch etching a bottom side of the cell pillar trench through the liner layer and the tunnel dielectric layer to expose a source layer of the substrate; and filling the cell pillar trench with a polysilicon material to form a cell pillar.

24. The method of claim 21, wherein the metal material includes a material selected from the group consisting of TiN, TiCN, TaN, TiSiN, WSix, RuTiN, RuOx, TaSiN, TaCON, TiCON, and combinations thereof.

25. The method of claim 21, wherein the metal material includes TiN.

* * * * *